United States Patent [19]
Poisner et al.

[11] Patent Number: 5,802,269
[45] Date of Patent: Sep. 1, 1998

[54] METHOD AND APPARATUS FOR POWER MANAGEMENT OF DISTRIBUTED DIRECT MEMORY ACCESS (DDMA) DEVICES

[75] Inventors: David Poisner, Folsom; Rajesh Raman, Fair Oaks, both of Calif.

[73] Assignee: Intel Corporation, Santa Clara, Calif.

[21] Appl. No.: 672,869

[22] Filed: Jun. 28, 1996

[51] Int. Cl.$^6$ ............................................... G06F 11/00
[52] U.S. Cl. ........................... 395/183.2; 395/182.22; 395/835; 395/842; 395/750.01
[58] Field of Search .................... 395/182.22, 182.13, 395/183.2, 183.01, 185.1, 835, 837, 838, 842, 847, 848, 750.01, 750.03

[56] References Cited

U.S. PATENT DOCUMENTS

| | | | |
|---|---|---|---|
| 4,486,826 | 12/1984 | Wolff et al. | 395/183.2 |
| 4,872,110 | 10/1989 | Smith et al. | 364/200 |
| 4,974,150 | 11/1990 | Long et al. | 395/182.07 |
| 5,450,551 | 9/1995 | Amini et al. | 395/299 |
| 5,499,346 | 3/1996 | Amini et al. | 395/308 |
| 5,577,201 | 11/1996 | Chan et al. | 395/185.1 |
| 5,588,112 | 12/1996 | Dearth et al. | 395/182.07 |
| 5,590,377 | 12/1996 | Smith | 395/842 |
| 5,598,578 | 1/1997 | Hatta | 395/835 |
| 5,619,729 | 4/1997 | Bland et al. | 395/848 |
| 5,630,142 | 5/1997 | Crump et al. | 395/182.22 |

FOREIGN PATENT DOCUMENTS

| | | | |
|---|---|---|---|
| 2 286 910 A | 8/1995 | United Kingdom | G06F 13/38 |
| WO 96/00940 | 1/1996 | WIPO | G06F 9/46 |

OTHER PUBLICATIONS

Compaq Computer Corporation et al., Distributed DMA Support for PCI Systems, Sep. 1, 1995, Revision 6.0.

Primary Examiner—Joseph Palys
Attorney, Agent, or Firm—Kenyon & Kenyon

[57] ABSTRACT

A method and apparatus for controlling accesses to DMA control registers, specifically operating according to a Distributed Direct Memory Access (DDMA) protocol. When an access to a peripheral device ends in a Master Abort due to the failure of the peripheral device to respond to the DDMA Master component during a DDMA transaction, a System Management Interrupt (SMI#) is generated to the central processing unit. In the resulting execution of the System Management Mode code by the CPU, the cause of the peripheral component not responding (e.g., that the peripheral is in a low power mode, the connection between the DDMA master and the peripheral is interrupted, etc.) is determined. The CPU, executing SMM code, takes steps to correct the problem. For example, if the peripheral is powered down, the CPU will power it up so that the DDMA transaction can subsequently occur. Alternatively, when BIOS is used to power down a peripheral device, the DDMA Master component can determine the peripheral's power status prior to trying the DMA access. If the peripheral device is powered down, the DDMA Master component issues an SMI# to the CPU to cause the peripheral to be powered up prior to the DDMA transaction.

24 Claims, 4 Drawing Sheets

METHOD AND APPARATUS FOR POWER MANAGEMENT OF DISTRIBUTED DIRECT MEMORY ACCESS (DDMA) DEVICES

BACKGROUND OF THE INVENTION

The present invention pertains to a method and apparatus for managing peripheral devices coupled to a bus, and more particularly, to a method and apparatus for managing power consumption of peripheral devices which are accessed in a Distributed Direct Memory Access (DDMA) environment.

Figure 1:
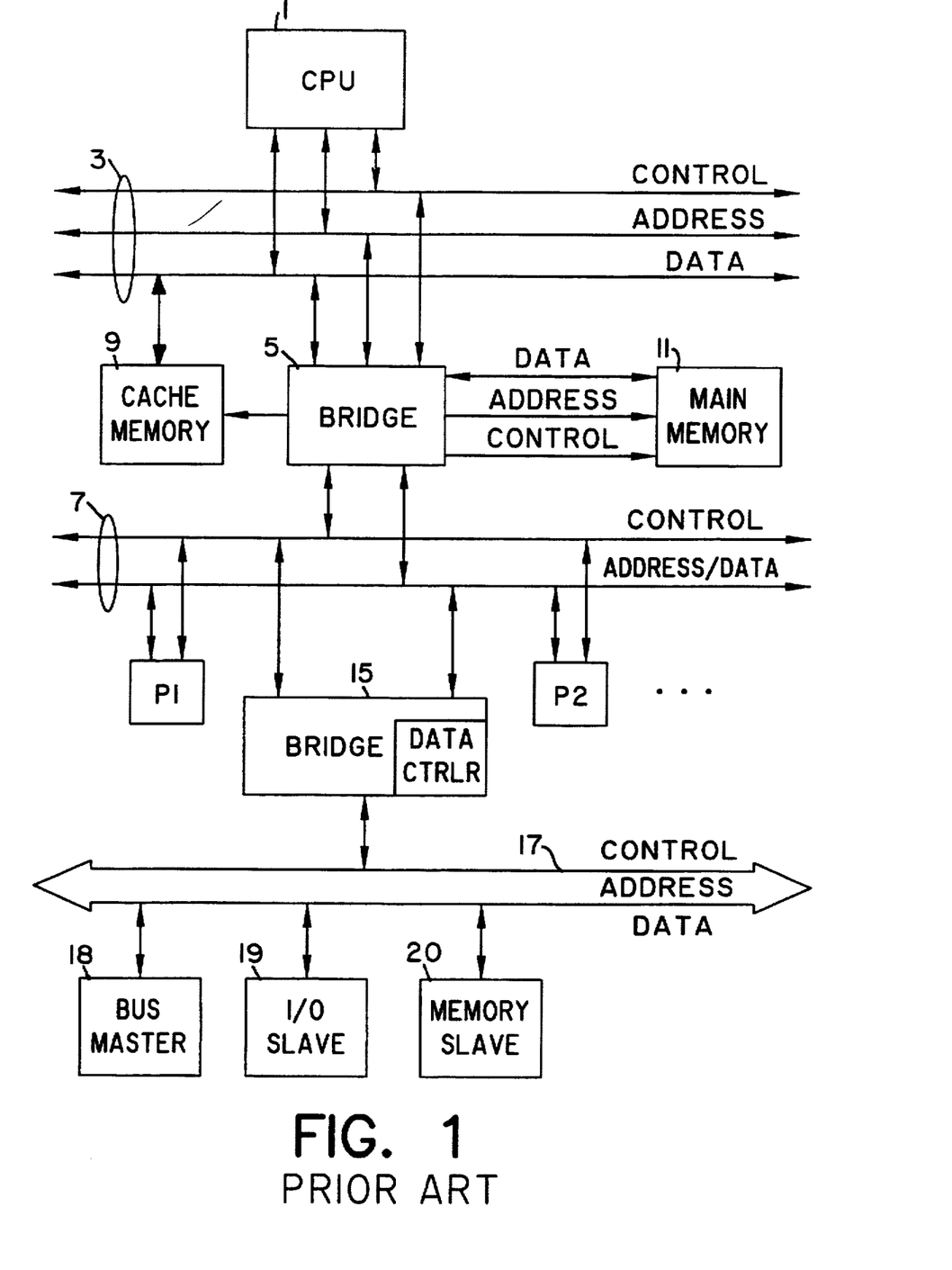
FIG. 1 is a computer system for implementing a Direct Memory Access operation as known in the art.

The DDMA environment is an improvement over the well-known Direct Memory Access (DMA) environment shown in FIG. 1 with a Peripheral Component Interconnect (PCI) architecture. In a PCI architecture, such as Revision 2.1 promulgated by Intel Corporation, Santa Clara, Calif., 1995, CPU 1 is coupled to a host bus 3 comprising signal lines for control, address, and data information. A first bridge circuit (also called a host bridge or North bridge circuit) 5 is coupled between the host bus and the PCI bus 7 comprising signal lines for control information and address/data information. The bridge circuit 5 contains cache controller circuitry and main memory controller circuitry to control accesses to cache memory 9 and main memory 11. Data from the main memory 11 can be transferred to/from the data lines of the host bus 3 and the address/data lines of the PCI bus 7 via the first bridge circuit 5. A plurality of peripheral devices P1, P2, . . . are coupled to the PCI bus 7 which can be any of a variety of devices such as a SCSI host bus adapter, a LAN adapter, a graphics adapter, an audio peripheral device, etc. A second bridge circuit (also known as a South bridge) 15 is coupled between the PCI bus 7 and an expansion bus 17 such as an ISA or EISA bus. Coupled to the expansion bus are a plurality of peripheral devices such as a bus master 18, an I/O slave 19, and a memory slave 20. A bus master is a device that is capable of initiating a data transfer with another device.

The second bridge 15 typically contains one or more controllers for handling Direct Memory Access (DMA) between the main memory 11 and a peripheral coupled to the expansion bus 17. The DMA controller in bridge 15 is, thus, a bus master. One such controller is the 82C37A-5 high performance programmable DMA controller manufactured by Intel Corporation of Santa Clara, Calif. A description of the operation of the 8237A controller can be found, for example, at pages 5–4 to 5–21 of the databook "Peripheral Components" 1995 published by Intel Corporation, the disclosure of which is hereby incorporated by reference in its entirety. Two such 8237 controllers can be coupled together in a known manner to set up seven standard programming model DMA channels for seven devices coupled to the expansion bus 17 or PCI bus 7. As is also known in the art, the DMA controllers handle the I/O "handshaking" signals that exist on the expansion bus 17 and the PCI bus 7 when data is being transferred to/from the main memory 11 (for example) and the peripheral devices coupled to these busses 7, 17 without intervention by the CPU 1. The CPU 1 and the DMA controllers communicate via the control signal lines appearing on the host bus 3 and the PCI bus 7 through the bridge circuit 5.

Prior to a typical transfer between a peripheral device and the main memory 11, the CPU 1 transfers data to the appropriate registers in the DMA controller assigned to a particular DMA channel. The initialization data stored in these registers typically concern the start address in main memory, the type of transfer (e.g., read or write operation), etc. The CPU 1 then enables the peripheral device to initiate a DMA transfer. The peripheral device (e.g., bus master 18) then initiates a DMA transfer by sending a request to the DMA controller in bridge circuit 15. The DMA controller then obtains bus access and controls the DMA transfer between main memory 11 and the peripheral 18 without further intervention by the CPU 1.

An enhancement to the DMA system described above is the Distributed Direct Memory Access (DDMA) system. A protocol for implementing DDMA for bus systems such as a PCI bus system has been promulgated by Compaq Computer Corporation and others entitled "Distributed DMA Support for PCI Systems" Revision 6.0, Sep. 1, 1995, the disclosure of which is hereby incorporated by reference in its entirety. In contrast to the DMA system, in a DDMA system, the independent, standard programming model Bus Master channels are distributed among peripheral devices. In other words, registers associated with individual DMA channels which normally reside in the DMA controller in the DMA system described above can physically reside outside of the DMA controller in the second bridge circuit 15. For example, they reside in I/O devices coupled to the PCI bus 7. The effect is that at the beginning of a DDMA transaction, the CPU 1 attempts to access registers associated with a distributed DMA channel, and a DDMA Master component (not shown in FIG. 1) translates (or redirects) the PCI I/O reads and writes to the DMA I/O channel into reads and writes to a DDMA Slave (e.g., an audio peripheral device). For this DDMA protocol, the DDMA Master component is defined which monitors signals appearing on the PCI bus 7. In a typical DDMA transfer, the CPU 1 continues to access the DMA controller in the second bridge circuit 15. If an access is attempted to a DMA channel that is distributed in some PCI peripheral, the DDMA Master collects or distributes the data before letting the CPU complete its accesses to the DMA channel. The DDMA Master will assert the necessary control signal(s) such that the CPU "thinks" that it is accessing a standard 8237-based design even though those registers are not located with the DMA controller(s).

There are several situations in which a distributed peripheral will not respond during a DDMA access by the CPU (via the bridge circuit 5) or another bus master component. These situations include where: 1) the peripheral device is electrically shut off, 2) the peripheral is coupled to an additional PCI bus coupled to the PCI bus 7 and the additional PCI bus is physically detached from the PCI bus 7 (e.g., when a notebook computer is pulled out of a docking station) or the bridge circuit coupling the two busses together is not operating properly, 3) the clock to such an additional PCI bus is shut off, or 4) the peripheral is in a low power mode and is unable to respond. In a DDMA system, if the peripheral device will not respond, the CPU 1 (or the bus master in question) will perceive a Master Abort on the PCI bus. During such a process the CPU 1 will disconnect from the bus and return the bus to an idle state so that it is available for use by another bus master device. In executing a Master Abort, the bus master must set its Master Abort Detected (or Received Master Abort) bit in its configuration status register.

The software that ultimately is seeking the transfer of data to/from the peripheral device may determine that the peripheral device is being accessed even though a Master Abort has occurred which can lead to errors in operation. Also, peripheral devices that are powered down cannot be accessed at all by another device until such time as the peripheral device is powered up. Accordingly, there is a need for a method and apparatus that provides for a peripheral device to be easily powered up so as to participate in PCI I/O without a significant loss of performance. There is also a need for a bus system architecture that provides for lower overall system power consumption. Furthermore, there is a need for a method and apparatus for managing peripheral devices that allows for determining causes for Master Abort errors that occur in a computer system.

SUMMARY OF THE INVENTION

These and other needs are satisfied by the method and apparatus of the present invention. In a first embodiment of the present invention, when an access is attempted to a peripheral device that cannot respond (e.g., because it is powered down, or disconnected from the bus, etc.) an interrupt, such as a System Management Interrupt (SMI), is generated rather than allowing the access end in a Master Abort condition. During the execution of the System Management Mode software caused by the generation of the SMI, corrective actions are taken by the CPU so that the peripheral device can respond when the I/O cycle is retried. For example, if the execution of the BIOS code powers down a peripheral device, a bit is set in a memory device of a DDMA Master component. When an attempt is made to perform a DDMA transaction with the device that has been powered down, the DDMA Master component recognizes this fact and generates an SMI interrupt to the CPU instead of attempting the DDMA transaction. During the execution of the System Management Mode (SMM) code (in response to the SMI interrupt), the central processing unit attempts to power up the peripheral device so that the DDMA transaction can be completed when retried.

In an alternative embodiment, when an abort condition exists on the bus after an attempted access is made to a distributed DMA channel peripheral device (e.g., a Master Abort), a indication of that event is stored in a memory device for that particular channel. When such an indication is stored for a particular channel, an SMI interrupt is generated. During execution of the SMM code, the central processing unit (CPU) seeks to determine the cause of the Master Abort and takes corrective action. For example, the CPU may determine that the peripheral device is powered down and takes appropriate actions to have it powered up again so that a retry of the DDMA access will be successful.

DETAILED DESCRIPTION

Figure 2:
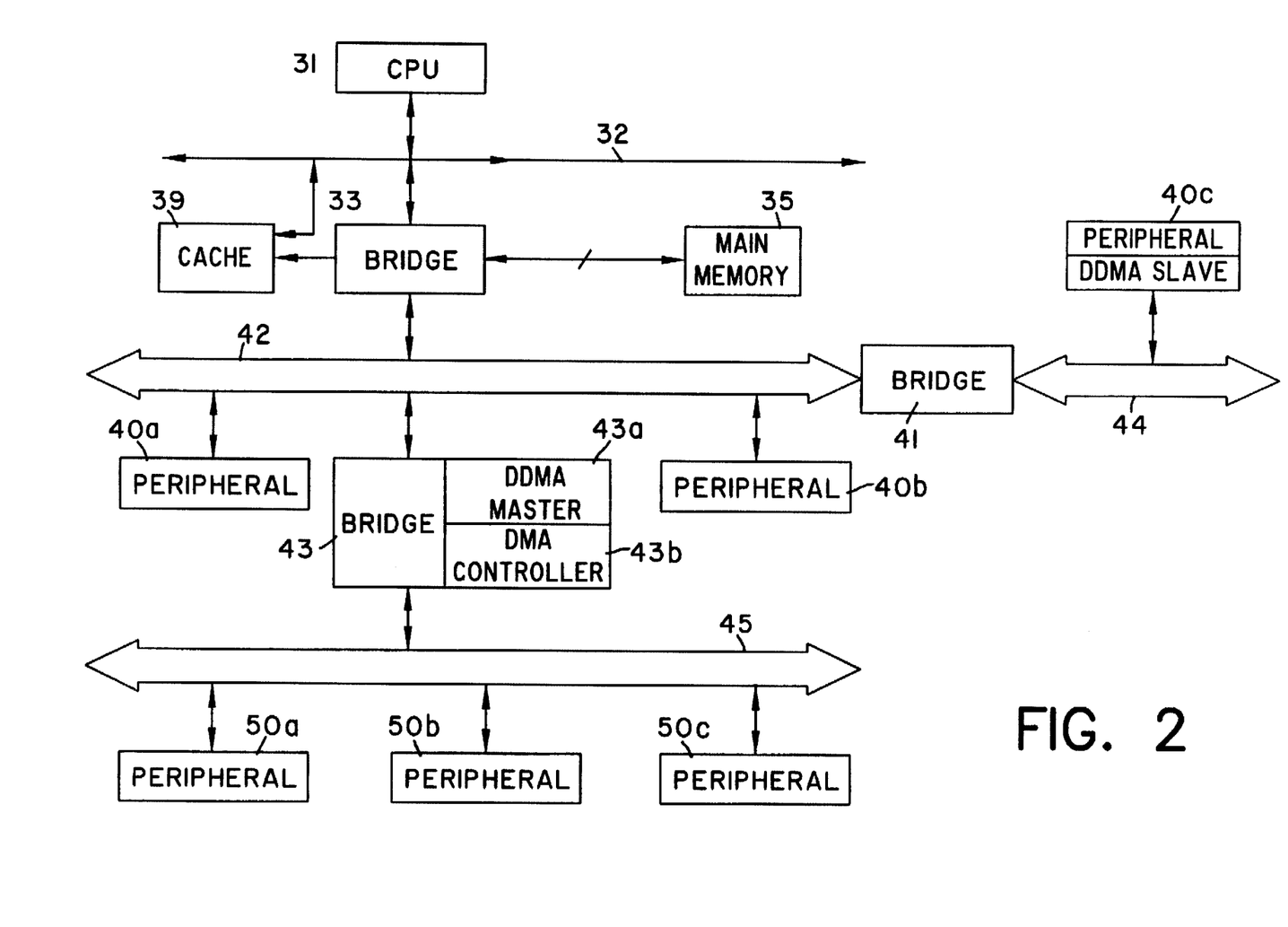
FIG. 2 is a computer system for implementing a Distributed Direct Memory Access operation which incorporates the method and apparatus of the present invention.

An exemplary environment for a DDMA system is shown in FIG. 2. As in FIG. 1, a CPU 31 is coupled to a first bridge circuit 33 via a host bus 32. The first bridge circuit contains a cache controller for controlling cache memory 39 and a main memory controller for controlling main memory 35. The first bridge circuit can also be coupled between the main memory 35 and the host bus 32 and a bus, such as PCI bus 42, to handle the transfer of data to/from main memory. The first bridge circuit 33 couples the CPU 31 to the PCI bus 42.

Coupled to the PCI bus are a plurality of peripheral components 40a, b. An additional PCI bus 44 is coupled to PCI bus 42 via an additional bridge 41. A further peripheral device 40c is coupled to this additional PCI bus 44. In this embodiment, the further peripheral device contains a DDMA slave component which includes the bus master registers necessary for conducting DMA accesses for its assigned channel as described in the aforementioned DDMA protocol. A second bridge circuit 43 is provided coupled between the PCI bus 42 and an expansion bus 45 to which other peripheral devices 50a-c are coupled. The second bridge 43 includes the DDMA Master component 43a which operates according to the DDMA protocol mentioned above, and a DMA controller which can be two 8237A DMA controllers connected in series so as to provide seven DMA channels.

Figure 3:
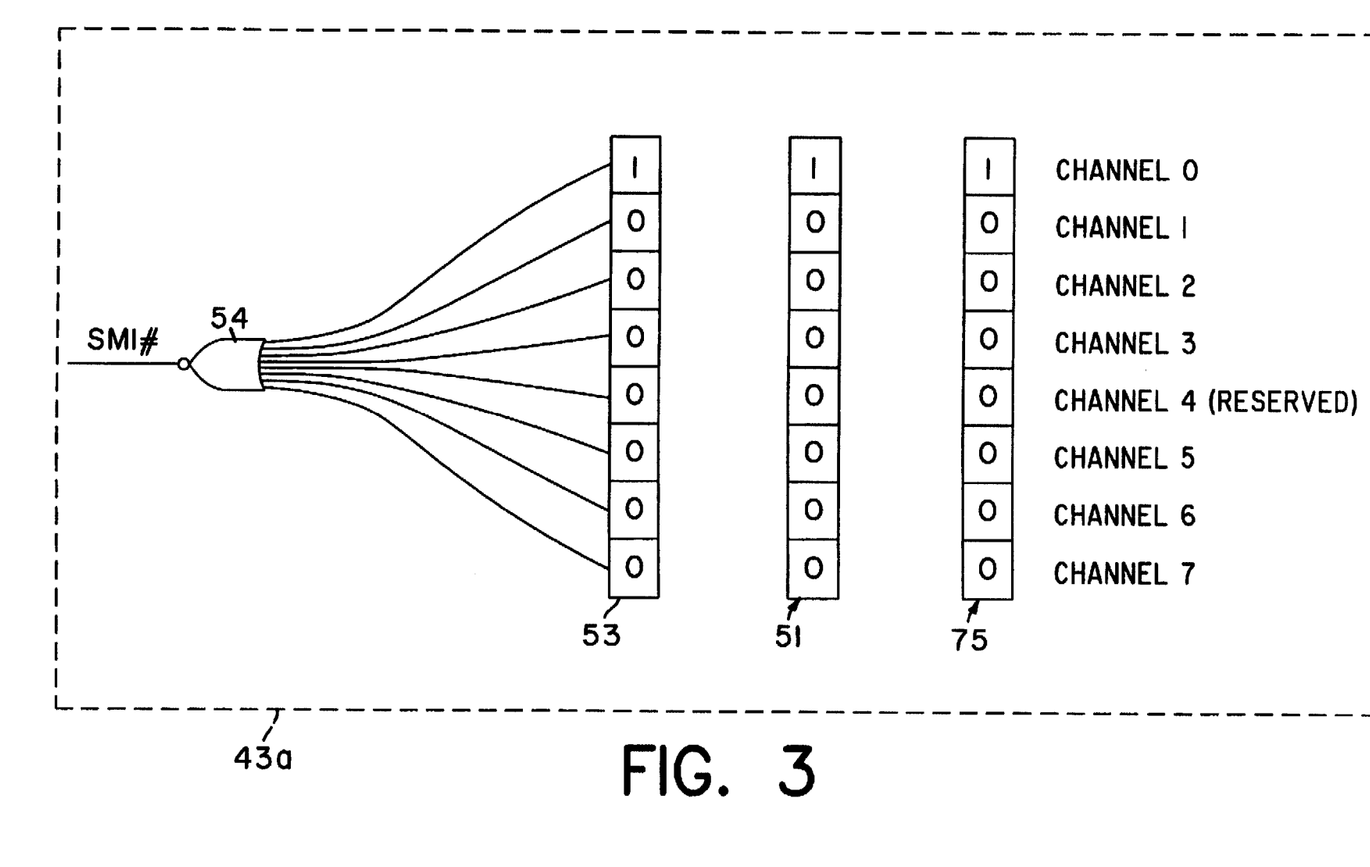
FIG. 3 shows memory devices, such as registers, used to control the operation of the computer system shown in FIG. 2.

In a write operation to initialize DDMA control registers, the CPU 31 attempts to access a DMA channel via the DMA controller 43b of the second bridge circuit 43 by writing to a channel address. In this example, the CPU 31 is attempting to initiate DMA registers to configure DMA channel 0. A register 51 (see FIG. 3) in the DDMA Master 43a of the second bridge circuit 43 stores an indication of whether channel 0 is a distributed DMA channel or not (seven channels are provided with channel 4 being reserved for cascading two 8237 controllers having four channels each). In this example, a "1" value indicates that channel 0 is a DDMA channel and is assigned to peripheral device 40c coupled to the additional PCI bus 44. One skilled in the art will appreciate that a DDMA transfer can also occur with peripheral devices coupled to the PCI bus 42 (e.g., peripheral devices 40a, b), for example. The register 51 location for channel 0 indicates that it is distributed by storing a "1" value therein. Since the peripheral corresponding to channel 0 is distributed, the attempt by the CPU to write to initialization registers associated with channel 0 in the DMA controller 43b will not be successful. Accordingly, when the CPU 31 initiates the write operation (i.e., a PCI I/O cycle) on the PCI bus 42, the DDMA Master 43a takes control of the PCI I/O cycle by driving a control signal DEVSEL# active (via the second bridge circuit 43). When the CPU 31, via the bridge circuit 33, sees that the DEVSEL# signal is active, it assumes that the target device has recognized its address on the PCI bus 42 (via the DMA controller 43b).

The DDMA Master 43a then asserts a PCI request signal (e.g., asserting a signal on a PCI REQ pin) to request use of the PCI bus 42 and also issues a PCI retry to terminate this particular I/O cycle. A PCI retry is the assertion of the STOP# signal and deassertion of the TRDY# signal while keeping the DEVSEL# signal asserted (all standard PCI signals). This informs the CPU that the target (i.e., the DDMA Master acting on behalf of the peripheral device 40c) does not intend to transfer the current data and the CPU must stop the current transaction and retry the same transaction at a later time. The first bridge circuit 33 will deassert its PCI request on behalf of the CPU 31.

When the DDMA Master 43a, in response to its PCI request signal, is granted the PCI bus by arbitration circuitry, it performs one or more write cycles to the peripheral 40c (when the peripheral claims the transaction by asserting the DEVSEL# signal on the bus) to send the appropriate channel write information for the DMA transaction (e.g., starting base address, word count, etc.). The DDMA Master 43a knows the proper address for accessing the peripheral 40c and uses the data obtained during the original write cycle of the CPU 31 to determine the proper values to write to the peripheral 40c and to the DMA controller 43b. The DDMA Master will then deassert the PCI REQ signal line and wait for the CPU to attempt the retry of the write operation. When the CPU retries the cycle, the DDMA Master 43a simply completes the I/O cycle because the data has already been written to the peripheral device 40c. Subsequently, the DMA transfer takes place between the main memory and the peripheral device.

A read operation is similar to the write operation. Once again, the DDMA Master 43a recognizes when the CPU 31 is attempting to read status information/data from the DMA controller 43b. The DMA Master 43a asserts DEVSEL#, issues a PCI REQ signal, and issues a PCI retry to the CPU 31. When the DDMA Master gains access to the PCI bus 42, it reads the individual channel read information from the peripheral device 40c. When the CPU 31 executes the retry of the read operation, the DDMA Master returns the individual channel read information. As seen above, it is the role of the DDMA Master device to redirect some I/O cycles to/from the standard DMA controllers as I/O cycles to/from DMA slave channels.

In a DDMA system, if the peripheral device will not respond to the DDMA Master (i.e., it will not claim the transaction by asserting the DEVSEL# signal), an abort condition, such as a Master Abort in a PCI architecture exists on the bus. During such a process the DDMA Master will deassert the IRDY# signal line and return the bus to an idle state so that it is available for use by another bus master device. In executing a Master Abort, the bus master (e.g., the DDMA Master in this case) must set its Master Abort Detected (or Received Master Abort) bit in its configuration status register. By recognizing the Master Abort on the PCI bus and in accordance with the present invention, a register 53 (See FIG. 3) is added to the DDMA Master component 43a which stores information as to whether a Master Abort has occurred with a specific DMA channel. In this embodiment, register 53 has binary locations for each of the DMA channels, and a "1" value indicates that a Master Abort occurred during the last access to that particular channel. Assuming that Channel 0 does not respond (which is mapped to peripheral 40c in FIG. 2), the bit corresponding to channel 0 in register 53 will be set to a "1." The register locations are coupled to an NOR gate 54, and its output will indicate when any of the bits in register 53 are set to a "1" value. When the output of the NOR gate is set to a "0," an interrupt such as a System Management Interrupt (SMI#) is generated by the DDMA Master. In this embodiment, the SMI request is sent to the SMI# input of the CPU 31. Upon receipt of the SMI# interrupt, the CPU 31 latches the interrupt internally, and when the SMI# is recognized on an instruction boundary, the CPU 31 will go into a System Management Mode (SMM) and assert its SMIACT# signal.

Figure 4:
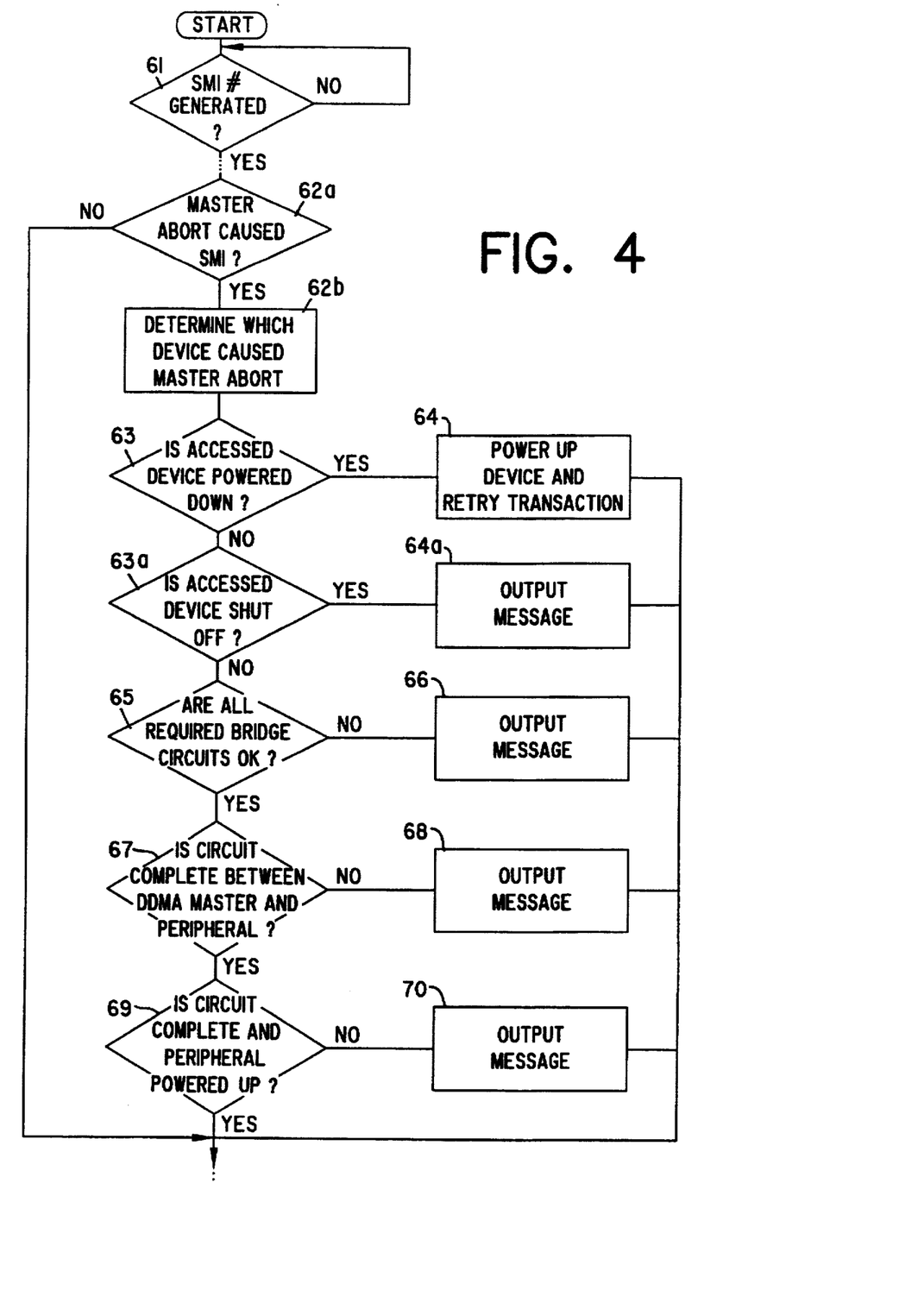
FIG. 4 is a flow diagram of the operation of the System Management Mode code according to the present invention.

During System Management Mode, the CPU 31 executes code out of System Management Random Access Memory (SMRAM) which can be part of the main memory 35. An example of the SMM code can be found in most motherboards and is typically provided by the Original Equipment Manufacturer (OEM). Referring to FIG. 4, the SMM code is altered somewhat to include further features commensurate with the generation of the SMI# interrupt. In decision block 61, the operation of the code first checks to see if an SMI# interrupt has been generated. Subsequent to the detection of the SMI# interrupt, the operation of the SMM code determines at decision block 62a whether a Master Abort caused the SMI# interrupt which is determined by accessing the configuration status register of the DDMA Master and accessing the RMA bit. If a Master Abort has occurred, the operation of the SMM code then determines in block 62b which device caused the Master Abort which can also be determined from the registers in the DDMA Master. The operation of the code then attempts to see what caused the Master Abort in the peripheral device by first determining if the accessed peripheral device is powered down in decision block 63. If the peripheral device is powered down (i.e., operating in a low power consumption mode where the device is either consuming a relatively small amount of power or no power at all), then the device is caused to power up (e.g., by issuing a proper command to the controller device which controls the powered-down peripheral device). Subsequently, and as a last step, the code forces the CPU to retry the DDMA transaction that ended in a Master Abort since the device is now powered up and ready for the transaction. If it is not determined that the accessed peripheral device is in a low power mode, control passes to decision block 63a where it is determined whether the peripheral device is electrically shut off. If the device is shut off, control passes to block 64a, where an output message or the like is generated in order to obtain user assistance in turning on the peripheral device. Control then passes to decision block 65 where the operation of the code determines if the bridge circuits(s) (e.g., bridge circuit 41 in FIG. 2) between the peripheral device and the DDMA Master 43a is(are) operating correctly. If they are not, control passes to block 66, where a message is output to the user indicating that a particular bridge circuit is not operating properly. If the bridge circuits are operating correctly, control passes to decision block 67 where it is determined whether the circuit is complete between the DDMA Master and the peripheral device (including whether the clocking signal is being supplied to an additional bus). If the connection between the two devices is broken (e.g., when a note-book computer is removed from a docking station), a message is output to the user indicating that an access was attempted to a device that is missing in block 68. Otherwise, control passes to decision block 69, where the operation of the SMM code determines whether the accessed device is powered up and the circuit between the DDMA devices is complete and operable. If these conditions are true and the peripheral device failed to claim the transaction, then either the pointer in the DDMA table is incorrect, or the peripheral itself is broken. In that situation, control passes to block 70 and a message is output to the user. If the SMI# interrupt was generated for some reason other than a Master Abort condition or a failed access of a peripheral using the DDMA Master, the SMM code continues to operate as before.

Referring again to FIG. 3, a third register 75 is shown that can be used in conjunction with powering up a peripheral operating in a low power consumption mode. In a computer system, the Basic Input/Output System (BIOS) software can be used to power down a peripheral coupled to the PCI bus 42 (including devices coupled to other busses coupled to the PCI bus 42, such as peripheral 40c). BIOS also has access to the registers within the DDMA Master. Thus according to another embodiment of the present invention, if the BIOS code operates to power down a peripheral that is assigned a DDMA channel, then an appropriate bit is set in register 75 of FIG. 3. For example, if the BIOS code operates to place peripheral 40c into a low power mode, then the first bit of register 75 is set to a "1." Accordingly, prior to any access of the peripheral device 40c by the DDMA Master, register 75 is accessed to determine whether the BIOS had powered down that device (which is accessed as DMA channel 0). If the bit is set, then an SMI# interrupt is generated so that the device can be powered up prior to executing the DMA access (in a manner similar to the operation of the SMM code in blocks 63 and 64 of FIG. 4). After the device is powered up during execution of the SMM code, the appropriate bit in register 75 is reset and the DDMA Master 43a forces CPU 31 to retry the DMA operation, as discussed above.

While in a low power mode, the DDMA Master device 43a can recognize that an access is being attempted to a device that is powered down. Since peripherals such as device 40c need not recognize PCI I/O cycles on the bus, these devices can be powered down to reduce power consumption. The Master Abort can be used to indicate that the peripheral device 40c has been placed in a low power consumption mode and an SMI# interrupt can be generated at that time to power up the peripheral device. Alternatively, an SMI# interrupt is generated instead of waiting for a Master Abort condition, and the interrupt causes the peripheral device to be powered up for the upcoming DMA transaction. Thus, the method and apparatus of the present invention achieve a great savings in overall system power consumption. Also, since the peripheral device need not recognize PCI I/O cycles on the bus while operating in a low power consumption mode, additional hardware at the peripheral device to recognize when it is being accessed is not needed.

What is claimed is:

1. A method of operating a computer system comprising a central processing unit, a Direct Memory Access (DMA) controller, a Distributed Direct Memory Access (DDMA) Master component and a peripheral device coupled together by at least one bus, when the peripheral device fails to respond to a DDMA transaction controlled by said DDMA Master component, the method comprising:

generating an abort condition on the bus, when said peripheral fails to respond;

storing an indication that said abort condition occurred because of the failure of said peripheral device to respond to said DDMA Master component;

generating an interrupt to said central processing unit; and executing code in said central processing unit to determine the cause of the failure of said peripheral device to respond to said DDMA Master component.

2. The method of claim 1 wherein in said generating an abort condition step, said peripheral device fails to respond because said peripheral device is operating in a low power consumption mode and in said executing step said failure to respond is detected by said central processing unit.

3. The method of claim 2, wherein in said executing step, said central processing unit causes said peripheral device to be powered up.

4. The method of claim 3, further comprising:

retrying said DDMA transaction after said peripheral device is powered up.

5. The method of claim 4, wherein said bus operates according to a Peripheral Component Interconnect (PCI) architecture, said abort is a Master Abort condition, said interrupt is a System Management Interrupt (SMI#), and said code is System Management Mode (SMM) code.

6. The method of claim 1 wherein said peripheral device is coupled to an additional bus coupled to said bus via a bridge circuit, and wherein said failure results from said bridge circuit operating in an improper manner causing said peripheral device to fail to respond to said DDMA Master component, said central processing unit outputting a message indicating said failure.

7. The method of claim 1 wherein said peripheral device is coupled to an additional bus which is capable of being coupled to said bus via a bridge circuit, and wherein said additional bus is disconnected from said bus causing said peripheral device to fail to respond to said DDMA Master component, said central processing unit outputting a message indicating said failure.

8. The method of claim 1 wherein said peripheral device is coupled to an additional bus which is capable of being coupled to said bus via a bridge circuit, and wherein a clocking signal supplied to said additional bus is shut off causing said peripheral device to fail to respond to said DDMA Master component, said central processing unit outputting a message indicating said failure.

9. The method of claim 1 wherein said peripheral device fails to respond because it is electrically shut off and said failure to respond is detected by said central processing unit during said executing step.

10. A method of operating a computer system comprising a central processing unit, a Direct Memory Access (DMA) controller, a Distributed Direct Memory Access (DDMA) Master component and a peripheral device coupled together by at least one bus, the method comprising:

executing Basic Input/Output System (BIOS) code from a memory coupled to said central processing unit to cause said peripheral device to be placed in a low power consumption mode;

storing an indication that said peripheral device is in a low power consumption mode;

upon initiation of an access to said peripheral device, determining whether said peripheral device is operating in a low power consumption mode prior to accessing said peripheral device by the DDMA Master component;

generating an interrupt to said central processing unit; and executing additional code in said central processing unit causing said central processing unit to power up said peripheral device.

11. The method of claim 10, wherein said bus operates according to a Peripheral Component Interconnect (PCI) architecture, said interrupt is a System Management Interrupt (SMI#), and said additional code is System Management Mode (SMM) code.

12. The method of claim 10 wherein in said executing BIOS code step said peripheral device is electrically shut off and said peripheral device is powered up by said central processing unit during said executing additional code step.

13. A method of operating a computer system comprising a central processing unit, a Direct Memory Access (DMA) controller, a Distributed Direct Memory Access (DDMA) Master component and a peripheral device coupled together by at least one bus, when the peripheral device fails to respond to a DDMA transaction controlled by said DDMA Master component because the peripheral is operating in a low power consumption mode, the method comprising:

generating an abort condition on the bus, when said peripheral fails to respond;

storing an indication that said abort condition occurred after the failure of said peripheral device to respond to said DDMA Master component;

generating an interrupt to said central processing unit;

detecting said failure to respond by said central processing unit; and powering up said peripheral device by said central processing unit.

14. A computer system comprising:

a central processing unit;

a peripheral device coupled to said central processing unit via at least one bus;

a Direct Memory Access (DMA) controller coupled to said bus and controlling Direct Memory Access transactions on said bus;

a Distributed Direct Memory Access (DDMA) Master component coupled to said bus and initiating Distributed Direct Memory Access transactions over said bus including said peripheral device, such that when said peripheral device fails to respond to a DDMA transaction directed to said peripheral device by said DDMA Master component an abort condition is generated on the bus and said DDMA Master component stores an indication said peripheral device failed to respond and generates an interrupt to said central processing unit; and said central processing unit is programmed to operate such that when said interrupt is received, said central processing unit determines the cause of the failure of said peripheral device to respond to said DDMA Master component.

15. The system of claim 14 wherein said peripheral device fails to respond because said peripheral device is operating in a low power consumption mode and said failure to respond is detected by said central processing unit.

16. The system of claim 15, wherein said central processing unit is programmed to cause said peripheral device to be powered up.

17. The system of claim 16 wherein said bus operates according to a Peripheral Component Interconnect (PCI) architecture, said abort is a Master Abort condition, said interrupt is a System Management Interrupt (SMI#), and said central processing unit is programmed using System Management Mode (SMM) code.

18. The system of claim 14 wherein said peripheral device is coupled to an additional bus coupled to said bus via a bridge circuit, and wherein said failure results from said bridge circuit operating in an improper manner causing said peripheral device to fail to respond to said DDMA Master component, and said central processing unit outputting a message indicating said failure.

19. The system of claim 14 wherein said peripheral device is coupled to an additional bus which is capable of being coupled to said bus via a bridge circuit, and wherein said additional bus is disconnected from said bus causing said peripheral device to fail to respond to said DDMA Master component, and said central processing unit outputting a message indicating said failure.

20. The system of claim 14 wherein said peripheral device is coupled to an additional bus which is capable of being coupled to said bus via a bridge circuit, and wherein a clocking signal supplied to said additional bus is shut off causing said peripheral device to fail to respond to said DDMA Master component, and said central processing unit outputting a message indicating said failure.

21. The system of claim 14 wherein said peripheral device fails to respond because said peripheral device is electrically shut off and said failure to respond is detected by said central processing unit.

22. A computer system comprising:

a central processing unit;

a peripheral device coupled to said central processing unit via a bus;

a Direct Memory Access (DMA) controller coupled to said bus and controlling Direct Memory Access transactions on said bus;

a Distributed Direct Memory Access (DDMA) Master component coupled to said bus and initiating Distributed Direct Memory Access transactions over said bus including said peripheral device;

said central processing unit is capable of executing Basic Input/Output System (BIOS) code to cause said peripheral device to placed in a low power consumption mode and to store an indication that said peripheral device is in a low power consumption mode;

said DDMA Master component operating to generate an interrupt to said central processing unit when said peripheral device is operating in a low power consumption mode prior to accessing said peripheral device in a DDMA transaction; and said central processing unit executes additional code causing said central processing unit to power up said peripheral device.

23. The system of claim 22, wherein said bus operates according to a Peripheral Component Interconnect (PCI) architecture, said interrupt is a System Management Interrupt (SMI#), and said additional code is System Management Mode (SMM) code.

24. The system of claim 22 wherein said central processing unit executing said Basic Input/Output System (BIOS) code causes said peripheral device to be electrically shut off.

* * * * *

UNITED STATES PATENT AND TRADEMARK OFFICE
CERTIFICATE OF CORRECTION

PATENT NO. : 5,802,269

DATED : September 1, 1998

INVENTOR(S) : David Poisner, et al

It is certified that error appears in the above-identified patent and that said Letters Patent is hereby corrected as shown below:

| | |
|---|---|
| Column 3, line 35 | "a indication" should be --an indication-- |
| Column 7, line 3 | "43 a" should be --43a-- |
| Column 8, line 44 | "step said" should be --step, said-- |
| Column 10, line 27 | "to placed" should be --to be placed-- |

Signed and Sealed this

Twenty-second Day of February, 2000

Attest:

Q. TODD DICKINSON

Attesting Officer      Commissioner of Patents and Trademarks